US010901282B2

(12) United States Patent
Lu et al.

(10) Patent No.: US 10,901,282 B2
(45) Date of Patent: Jan. 26, 2021

(54) THIN FILM TRANSISTOR SUBSTRATE AND MANUFACTURING METHOD THEREOF

(71) Applicant: Wuhan China Star Optoelectronics Technology Co., Ltd., Hubei (CN)

(72) Inventors: Gaiping Lu, Guangdong (CN); Jiawei Zhang, Guangdong (CN); Wei Tang, Guangdong (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 37 days.

(21) Appl. No.: 16/147,880

(22) Filed: Oct. 1, 2018

(65) Prior Publication Data

US 2019/0244982 A1 Aug. 8, 2019

Related U.S. Application Data

(63) Continuation of application No. PCT/CN2018/096925, filed on Jul. 25, 2018.

(30) Foreign Application Priority Data

Feb. 8, 2018 (CN) .......................... 2018 1 0129983

(51) Int. Cl.
*G02F 1/1368* (2006.01)
*G02F 1/1343* (2006.01)
(Continued)

(52) U.S. Cl.
CPC ...... *G02F 1/136227* (2013.01); *G02F 1/1368* (2013.01); *G02F 1/13338* (2013.01);
(Continued)

(58) Field of Classification Search
CPC ............ H01L 27/3248; H01L 27/3258; H01L 21/76802; H01L 21/76834; H01L 21/76877; H01L 27/1244; H01L 27/1248; H01L 27/1262; H01L 27/124; H01L 27/1251; H01L 27/1259; H01L 27/127; H01L 29/66757; H01L 29/78603;
(Continued)

(56) References Cited

U.S. PATENT DOCUMENTS

2007/0045740 A1 3/2007 Park
2009/0040442 A1* 2/2009 Tanno ............... G02F 1/134363 349/114
(Continued)

FOREIGN PATENT DOCUMENTS

CN 103489824 A 1/2014
CN 105590896 A 5/2016
(Continued)

*Primary Examiner* — Eric A. Ward

(57) ABSTRACT

The present disclosure provides a thin film transistor (TFT) substrate and a manufacturing method thereof. The TFT substrate include a TFT; a flat layer to cover the TFT; an opening hole defined in the flat layer and corresponding to a drain of the TFT; a bottom of the opening hole to retain a part of the flat layer for forming a flat layer sheet; a first metal layer formed on the flat layer; a first insulating layer formed on the first metal; a second metal formed on the first insulating layer and pass through the flat layer sheet for electrically connecting to the drain.

6 Claims, 5 Drawing Sheets

(51) Int. Cl.

| | |
|---|---|
| ***H01L 29/786*** | (2006.01) |
| ***G02F 1/1362*** | (2006.01) |
| ***H01L 27/12*** | (2006.01) |
| ***H01L 21/768*** | (2006.01) |
| ***G02F 1/1333*** | (2006.01) |
| ***H01L 29/66*** | (2006.01) |
| *G06F 3/041* | (2006.01) |

(52) U.S. Cl.

CPC .... *G02F 1/13439* (2013.01); *H01L 21/76802* (2013.01); *H01L 21/76834* (2013.01); *H01L 21/76877* (2013.01); *H01L 27/1244* (2013.01); *H01L 27/1248* (2013.01); *H01L 27/1262* (2013.01); *H01L 29/66757* (2013.01); *H01L 29/78603* (2013.01); *H01L 29/78636* (2013.01); *H01L 29/78675* (2013.01); *G02F 1/136204* (2013.01); *G02F 2001/13685* (2013.01); *G02F 2202/104* (2013.01); *G06F 3/041* (2013.01); *G06F 2203/04103* (2013.01)

(58) Field of Classification Search

CPC ......... H01L 29/78636; H01L 29/78675; H01L 29/78645; G02F 1/13622; G02F 1/13338; G02F 1/13439; G02F 1/136204; G02F 1/136227; G02F 1/1368; G02F 2001/13685; G02F 2202/104; G06F 2203/04103; G06F 3/041; G06F 3/0412; G06F 3/0443

See application file for complete search history.

(56) References Cited

U.S. PATENT DOCUMENTS

| | | | | |
|---|---|---|---|---|
| 2015/0116623 | A1* | 4/2015 | Tomioka | G02F 1/136227 349/43 |
| 2016/0187695 | A1* | 6/2016 | Cho | H01L 29/78633 349/12 |
| 2017/0033235 | A1* | 2/2017 | Tsao | H01L 27/124 |
| 2017/0131585 | A1* | 5/2017 | Cho | H01L 27/1259 |
| 2017/0293190 | A1* | 10/2017 | Kim | G02F 1/136227 |
| 2018/0149933 | A1 | 5/2018 | Wang | |
| 2018/0314118 | A1* | 11/2018 | Itou | G02F 1/133723 |
| 2018/0342540 | A1* | 11/2018 | Ying | G02F 1/134309 |
| 2020/0043996 | A1* | 2/2020 | Cheng | H01L 27/3246 |

FOREIGN PATENT DOCUMENTS

| | | | |
|---|---|---|---|
| CN | 107068897 | A | 8/2017 |
| CN | 107316839 | A | 11/2017 |

* cited by examiner

THIN FILM TRANSISTOR SUBSTRATE AND MANUFACTURING METHOD THEREOF

CROSS-REFERENCE TO RELATED APPLICATIONS

The present application is a continuation-application of International (PCT) Patent Application No. PCT/CN2018/096925, filed Jul. 25, 2018 which claims foreign priority of Chinese Patent Application No. 201810129983.7, filed on Feb. 8, 2018 in the State Intellectual Property Office of China, the contents of all of which are hereby incorporated by reference.

TECHNICAL FIELD

The present disclosure relates to the field of display technologies, and more particularly, to a thin film transistor substrate and manufacturing method thereof.

BACKGROUND

In conventional TFT-LCD (Thin Film Transistor-Liquid Crystal Display) panel manufacturing process, an insulation layer is prone to generate static electricity. Because the insulation layer itself is not conductive, the static electricity cannot be conducted away. The static electricity may be enter in a TFT of the panel through an opening hole defined in a flat layer, as shown in FIG. 1, resulting in a polysilicon layer and a gate insulation layer of the TFT being damaged. This will cause a gate, a source, and a drain short-circuit and the TFT damaged, further led to display panel lighting issues such as bring spots, thus reducing the qualified rate of product.

SUMMARY

A technical problem mainly solved by the present disclosure is to provide a thin film transistor substrate and manufacturing method thereof, to solve a problem that a TFT-LCD display panel is damaged by static electricity generated by an insulating layer.

To solve the above technical problem, the present disclosure adopts a technical solution as below. There is provided a thin film transistor (TFT) substrate, comprising:

- a TFT comprising:
  - a substrate;
  - a buffer layer, configured to cover the substrate;
  - a semiconductor layer, configured to cover a first part of the buffer layer, wherein a drain and a source are formed on the semiconductor layer;
  - a gate insulating layer, configured to cover the semiconductor layer and a part of the first part of the buffer layer, wherein a gate is formed on the gate insulating layer; and
  - a dielectric layer, configured to cover the gate insulating layer and the gate;
- a flat layer, configured to cover the TFT, the flat layer defining an opening hole corresponding to the drain of the TFT, wherein a part of the flat layer is retained in a bottom of the opening hole to form a flat layer sheet;
- a second insulating layer, located on the flat layer;
- a third metal layer, located on the second insulating layer;
- a third insulating layer, located on the third metal layer;
- a first metal layer, located on the third insulating layer;
- a first insulating layer, configured to cover the first metal layer and the opening hole; and
- a second metal layer, located on the first insulation layer to pass through the flat sheeting and electrically connect to the drain;
- wherein the source and the drain are pass through the dielectric layer and connected to the flat layer.

To solve the above technical problem, the present disclosure adopts another technical solution as below. There is provided a thin film transistor (TFT) substrate, comprising:

a TFT;

a flat layer, configured to cover the TFT, the flat layer defining an opening hole corresponding to a drain of the TFT, wherein a part of the flat layer is retained in a bottom of the opening hole to form a flat layer sheet;

a first metal layer, located on the flat layer;

a first insulating layer, configured to cover the first metal layer and the opening hole; and a second metal layer, located on the first insulation layer, to pass through the flat sheeting and electrically connect to the drain.

To solve the above technical problem, the present disclosure adopts still another technical solution as below. There is provided a manufacturing method of a thin film transistor (TFT) substrate comprising:

providing a TFT;

forming a flat layer on the TFT and covering the TFT;

defining an opening hole on the flat layer and corresponding to a drain of the TFT, wherein the opening hole is disconnected to the drain;

forming a first metal layer on the flat layer and the opening hole;

forming a first insulating layer on the first metal layer;

etching a bottom of the opening hole and exposing the drain; and forming a second metal on the first insulating layer and electrically connecting to the drain through the opening hole.

Beneficial effects of the present disclosure are as below. In contrast with the prior art, by way of a TFT substrate defines the opening hole in the flat layer to make the opening hole be electrically disconnected to the drain of the TFT. The metal layers and the insulating layers are formed on the flat layer in sequence, and the metal layers and the insulating layers formed in a bottom of the opening hole is etched to expose the drain of the TFT. A metal layer can be formed for electrically connecting to the drain of the TFT through the hole. The present disclosure can avoid the static electricity generated by the insulation layer entering in the TFT through the opening hole, resulting in a polysilicon layer and a gate insulation layer of the TFT being damaged, causing a gate, a source, and a drain short-circuit and the TFT damaged, further led to display panel lighting issues such as bring spots, to improve the qualified rate of product.

DETAILED DESCRIPTION

A clear and complete description of the technical schemes in the embodiments of the present disclosure will be made below with reference to the accompanying drawings in the embodiments of the present disclosure. Apparently, the embodiments as recited herein are merely a part of embodiments of the present disclosure instead of all embodiments. All other embodiments obtained by a person of ordinary skill in the art based on the embodiments of the present disclosure without creative efforts shall fall within the protection scope of the present disclosure.

Figure 1:
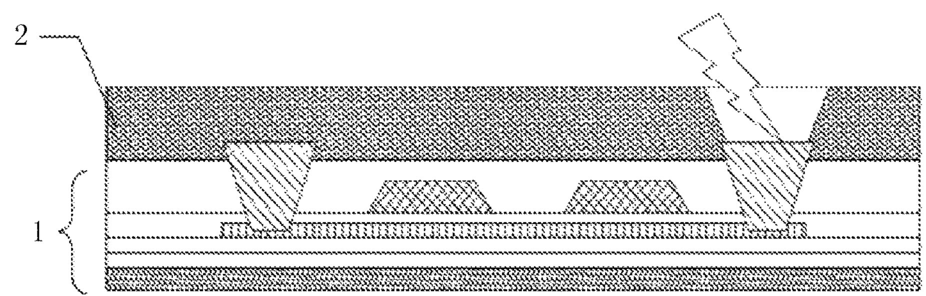
FIG. 1 is a schematic diagram of a static electricity generated by an insulation layer of a thin film transistor substrate enters a thin film transistor through an opening hole of the related art.
Figure 2A:
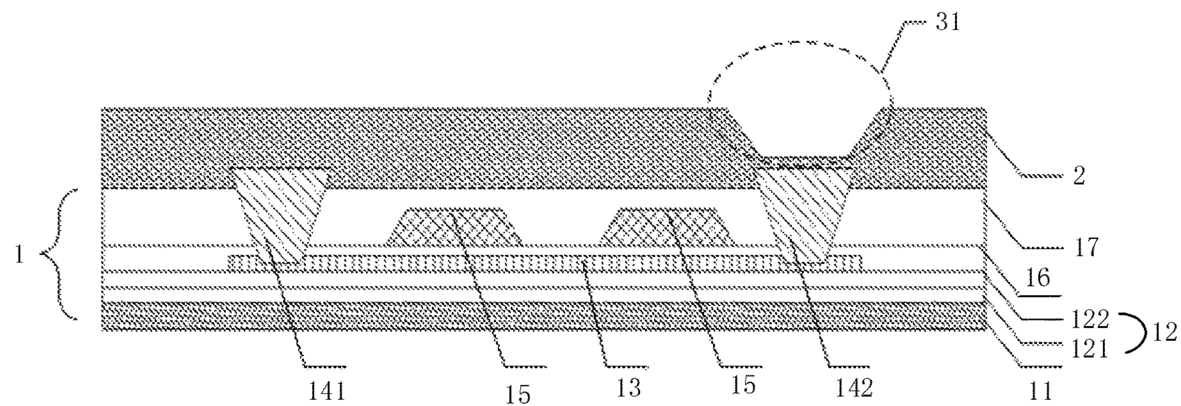
FIGS. 2*a* and 2*b* are schematic diagrams of a thin film transistor substrate according to a first embodiment of the present disclosure.
Figure 2B:
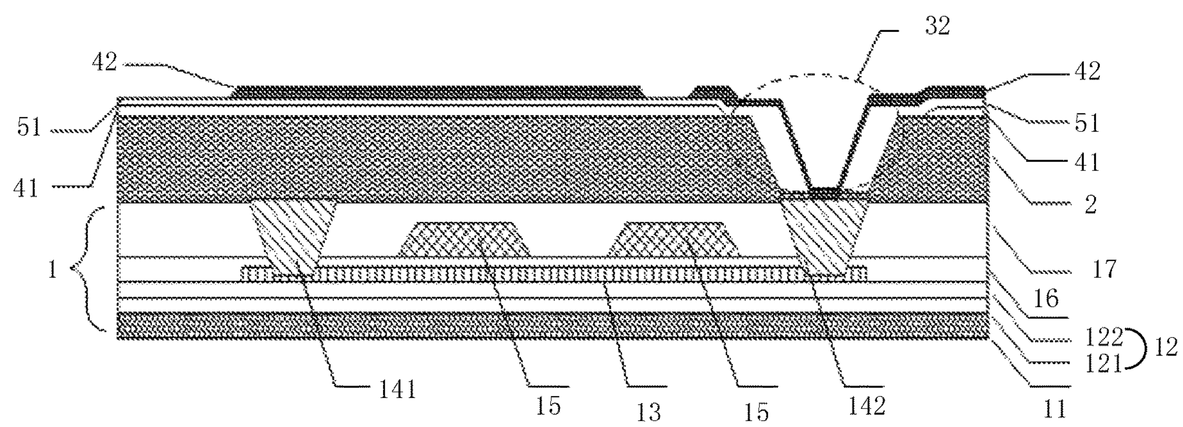

FIGS. 2*a* and 2*b* show schematic diagrams of a thin film transistor substrate according to a first embodiment of the present disclosure. The thin film transistor (TFT) substrate may include a TFT 1, a flat layer 2 covering the TFT 1, and an opening hole 31 defined in the flat layer 2. A part of the flat layer 2 may be retained in a bottom of the opening hole 31, to form a flat layer sheeting. The TFT 1 may include a substrate 11, a buffer layer 12, a semiconductor layer 13, a gate insulating layer 16, a gate 15, and a dielectric layer 17 in series. The buffer layer 12 may include two layers, which are a first buffer layer 121 and a second buffer layer 122. The buffer layer 12 may cover the substrate 11, to prevent metal ion, such as AI ion, Barium ion, and/or Na ion etc in the substrate 11 from entering the semiconductor layer 13 during thermal process, and reduce heat conduction. The semiconductor layer 13 partially covers the buffer layer 12. A source 141 and a drain 142 are formed on the semiconductor layer 13, to electrically be connected to the semiconductor layer 13. A gate insulating layer 16 may cover the semiconductor layer 13 and other part of the buffer layer 12, which are not covered by the semiconductor 13. A gate 15 may be formed on the gate insulating layer 16. A dielectric layer 17 may be filled between the gate 15, the source 141, the drain 142, and the flat layer 2. The source 141 and the drain 142 may be connected to the flat layer 2 through the dielectric layer 17.

The flat layer 2 may cover the entire TFT 1. The opening hole 31 may be formed in the flat layer 2 and corresponding to the drain 142. Partial flat layer 2 may be retained at a bottom of the opening hole 31, to form a flat layer sheeting to ensure that the drain 142 is not exposed.

Referring to FIG. 2*b*, the TFT substrate also may include a first metal layer 41, a first insulating layer 51, and a second metal layer 42 in series.

The first metal layer 41 is configured to cover the flat layer 2 and the opening hole 31.

The first insulating layer 51 is configured to cover the first metal layer 41. After the first insulating layer 51 is formed, the first insulating layer 51, the first metal layer 41, and the flat layer sheeting formed in a bottom of the opening hole 31 may be etched for forming a hole 32, to expose the drain 142.

The second metal layer 42 is configured to cover the first insulating layer 51 and electrically connect to the drain 142 through the hole 32. The circumference of the hole 32 may retain the second metal layer 42, the first insulating layer 51, and the first metal layer 41.

In one embodiment, the first metal layer 41 may be a common electrode, and the second metal layer 42 may be a pixel electrode.

Referring to FIGS. 3*a* to 3*e*, they show a schematic diagram of a thin film transistor substrate according to a second embodiment of the present disclosure. The second embodiment of the TFT substrate differs from the above described first embodiment in that: when the TFT substrate is used in a touch screen, the TFT substrate also may include a second insulating layer 52, a third metal layer 43, and a third insulating layer 53 in series. The second insulating layer 52, the third metal layer 43, and the third insulating layer 53 may be formed between the flat layer 2 and the first metal layer 41. The second insulating layer 52 may be formed in the flat layer 2. The third metal layer 43 may be formed on the second insulating layer 52. The third insulating layer 53 may be formed on the third metal layer 43. The third metal layer 43 may be etched for forming a touch layer. The first metal layer 41 may be etched for forming the common electrode. The second metal layer 42 may be etched for forming the pixel electrode. That is, the second insulating layer 52, the third metal layer 43, the third insulating layer 53, the first metal layer 41, and the first insulating layer 51, and the second metal layer 42 are formed in the flat layer 2 in series. And then, the flat layer 2, the second insulating layer 52, the third metal layer 43, the third insulating layer 53, the first metal layer 41, and the first insulating layer 51 formed in a bottom of the opening hole 31 may be etched for forming the hole 32, to expose the drain 142. And then, the second metal layer 42 may be formed on the first insulating layer 51, to electrically connect to the drain 142 through the hole 32.

Figure 3A:
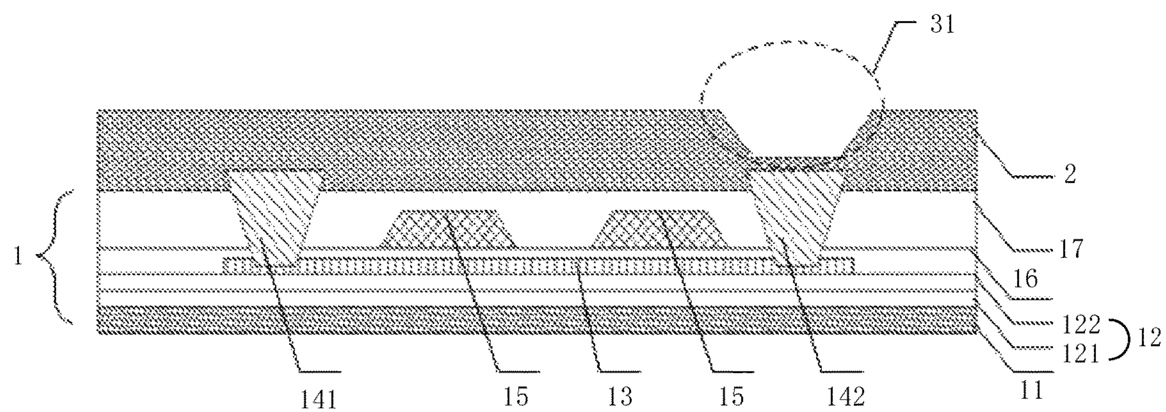
FIGS. 3*a* to 3*e* are schematic diagrams of a thin film transistor substrate according to a second embodiment of the present disclosure.
Figure 3B:
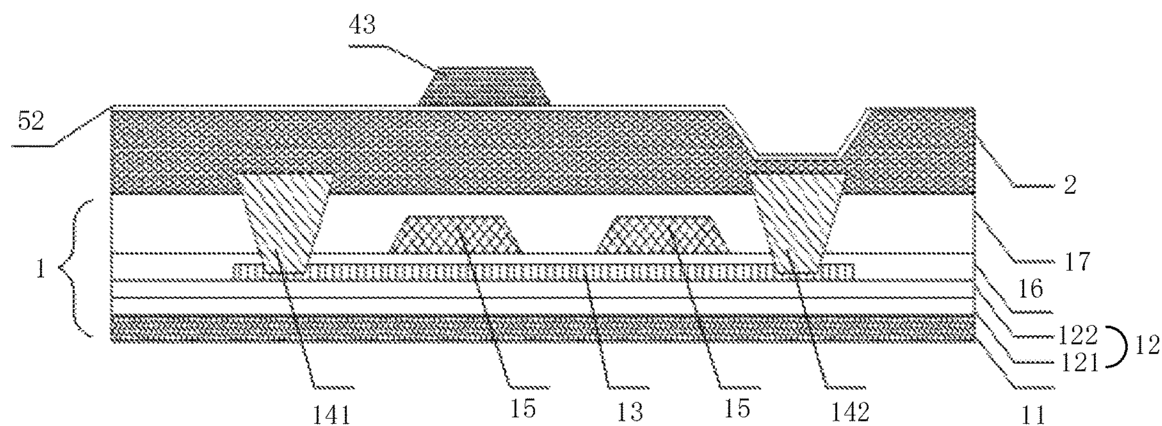
Figure 3C:
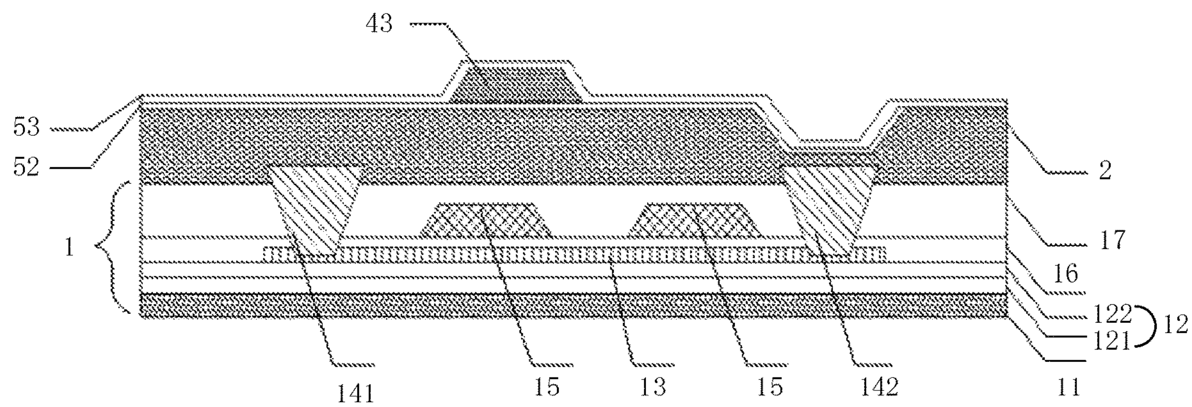
Figure 3D:
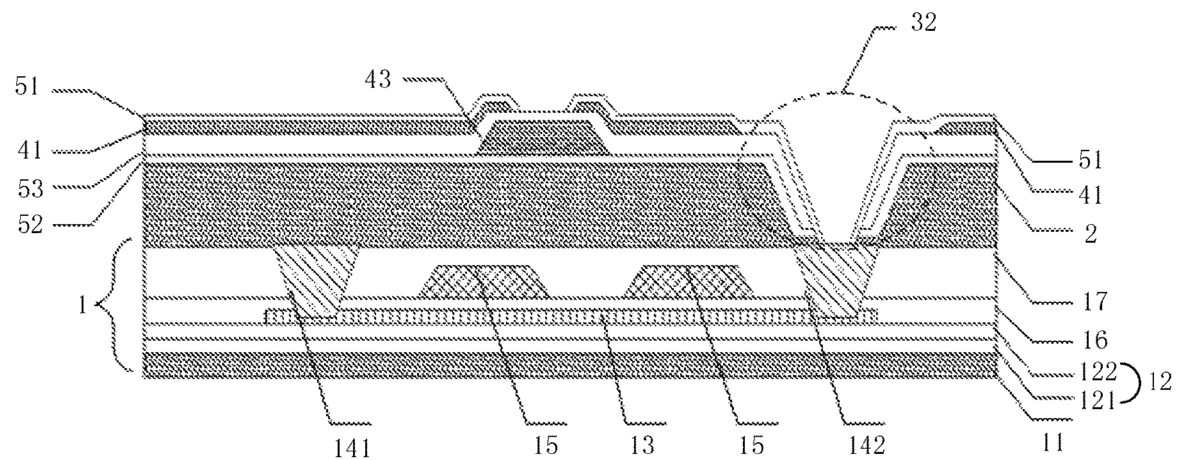
Figure 3E:
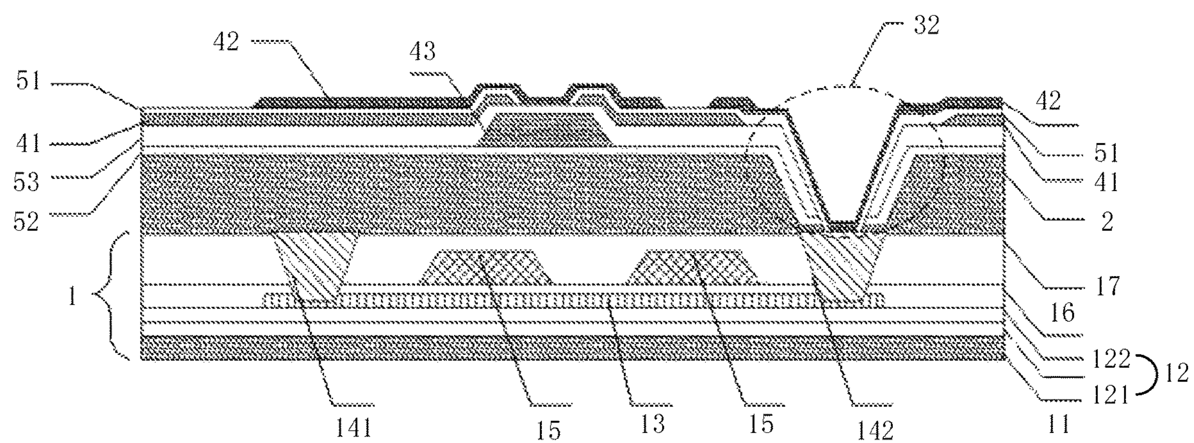

Specifically, the flat layer 2 may be formed on the TFT 1. The opening hole 31 may be defined in the flat layer 2 and corresponding to the drain 142. Partial flat layer 2 may be retained in a bottom of the opening hole 31, to make the drain 142 not be exposed (as shown in FIG. 3*a*). And then, the second insulating layer 52 may be formed on the flat layer 2. The third metal layer 43 may be formed on the second insulating layer 52 (as shown in FIG. 3*b*). The third insulating layer 53 may be formed on the third metal layer 43 (as shown in FIG. 3*c*). The first metal layer 41 and the first insulating layer 51 may be formed in the third insulating layer 53 in sequence. The flat layer sheeting, the second insulating layer 52, the third metal layer 43, the third insulating layer 53, the first metal layer 41, and the first insulating layer 51 are formed in a bottom of the opening hole 31 may be etched for forming the hole 32, to expose the drain 142 (as shown in FIG. 3*d*). Final, the second metal layer 42 may be formed on the first insulating layer 51, to electrically connect to the drain 142 through the hole 32 (as shown in FIG. 3*e*). The circumference of the hole 32 may retain the second insulating layer 52, the third metal layer 43, the third insulating layer 53, the first metal layer 41, and the first insulating layer 51.

In one embodiment, the first metal layer 41 and the second metal layer 42 may be made of Indium Tin Oxide (ITO). The flat layer 2 may be made of organic photoresist. The first buffer layer 121 may be made of SiNx, and the second buffer layer 122 may be made of SiOx. The semiconductor layer 13 may be made of Amorphous or polysilicon. In one embodiment, the semiconductor layer 13 may be made of polysilicon. The gate insulating layer 16 may be made of Silicon nitride, or silicon oxide, or a mixture of Silicon nitride and silicon oxide. The gate 15 may be made of Molybdenum, molybdenum alloy, aluminum, aluminum alloy in one or more.

Figure 4:
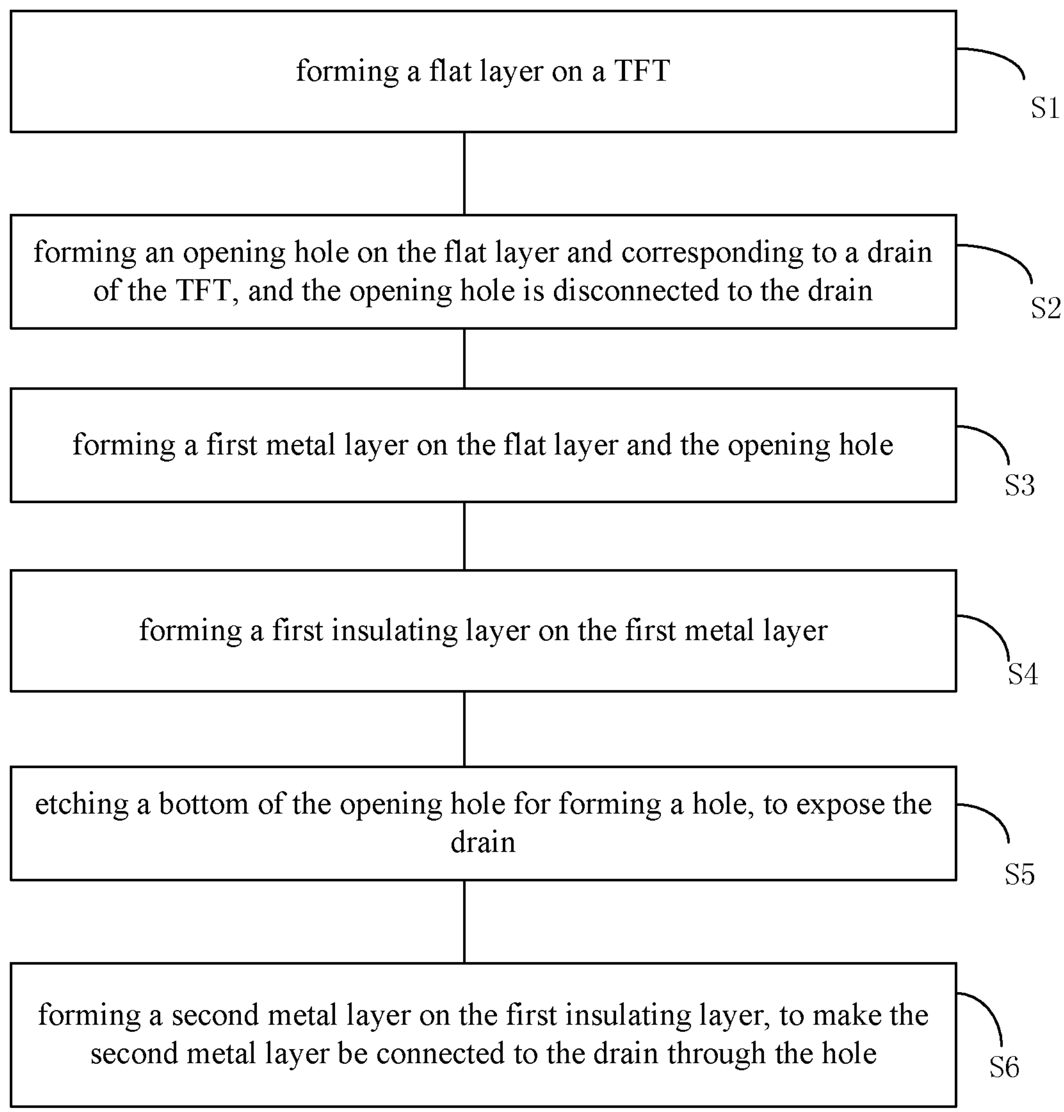
FIG. 4 is a flow diagram of a manufacturing method of a thin film transistor substrate according to a first embodiment of the present disclosure.

Referring to FIG. 4, it shows a flow diagram of a manufacturing method of a thin film transistor substrate according to a first embodiment of the present disclosure. The method includes:

Block S1: forming the flat layer 2 on the TFT 1 for covering the TFT 1.

Block S2: defining the opening hole 31 in the flat layer 2 and corresponding to the drain 142 of the TFT 1, wherein the opening hole 31 is disconnected with the drain 142.

Block S3: forming the first metal layer 41 on the flat layer 2 and the opening hole 31.

Block S4: forming the first insulating layer 51 on the first metal layer 41.

Block S5: etching a bottom of the opening hole 31 for forming the hole 32 and exposing the drain 142.

Block S6: forming the second metal layer 42 on the first insulating layer 51 and being electrically connected to the drain 142 through the hole 32.

Figure 5:
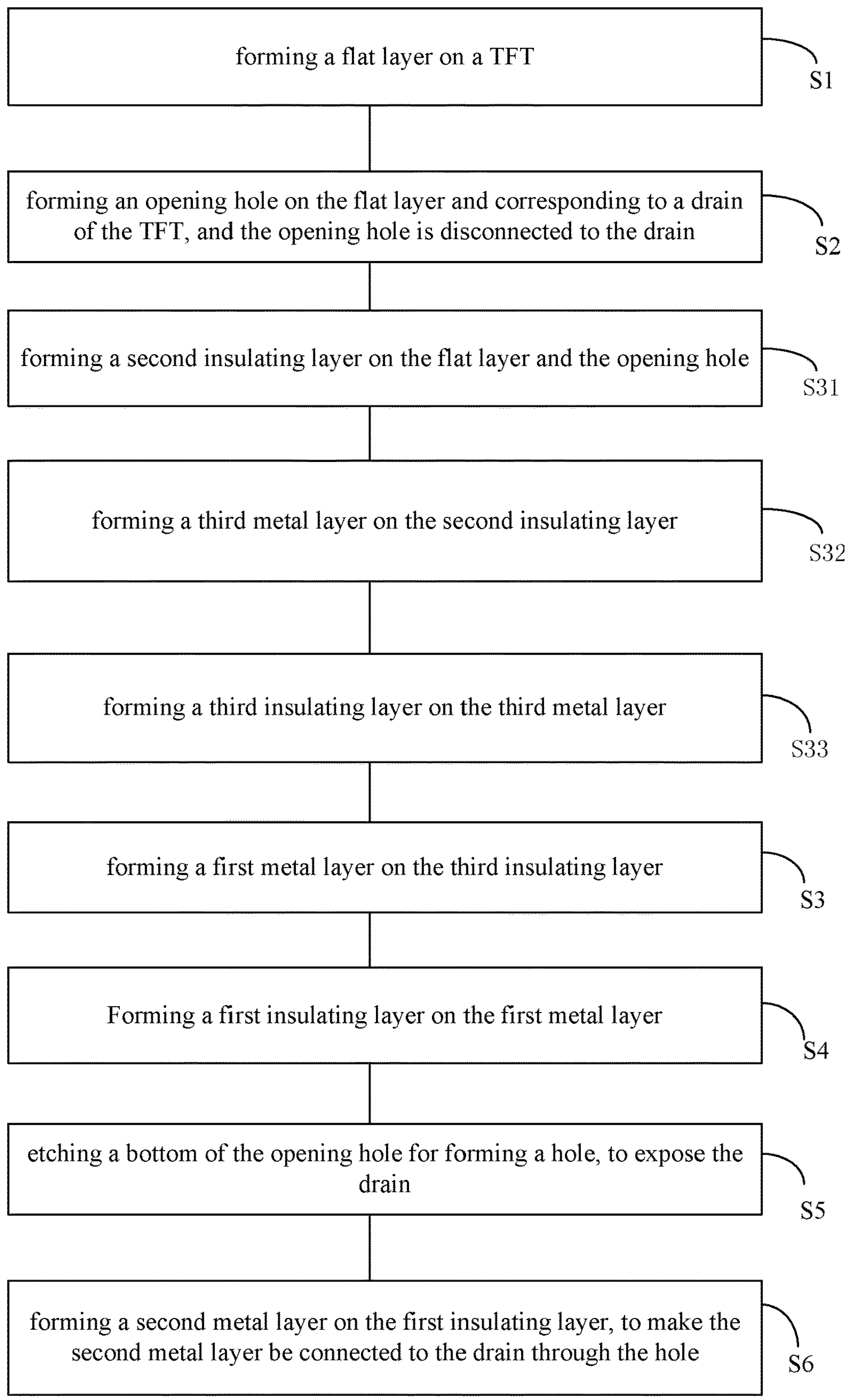
FIG. 5 is a flow diagram of a manufacturing method of a thin film transistor substrate according to a second embodiment of the present disclosure.

Referring to FIG. 5, it shows a flow diagram of a manufacturing method of a thin film transistor substrate according to a second embodiment of the present disclosure. The second embodiment of the manufacturing method differs from the above described first embodiment in that: some blocks may be included between the block S2 and S3:

Block S31: forming the second insulating layer 52 on the flat layer 2.

Block S32: forming the third metal layer 43 on the second insulating layer 52.

Block S33: forming the third insulating layer 53 on the third metal layer 43.

Wherein the third metal layer 43 may be etched for forming a touch layer. The first metal layer 41 may be etched for forming a common electrode. The second metal layer 42 may be etched for forming a pixel electrode. The second insulating layer 52, the third metal layer 43, the third insulating layer 53, the first metal layer 41, and the first insulating layer 51 may be formed on the flat layer 2 in series. And then, the flat layer sheeting, the second insulating layer 52, the third metal layer 43, the third insulating layer 53, the first metal layer 41, and the first insulating layer 51 formed on a bottom of the opening hole 31 may be etched for forming the hole 32, to expose the drain 142. Final, the second metal layer 42 may be formed on the first insulating layer 51, to electrically connect to the drain 142.

Specifically, referring to a combination of FIGS. 3*a* to 3*e*, firstly, the flat layer 2 may be formed on the TFT 1. An opening hole 31 may be defined in the flat layer 2 and corresponding to the drain 142, and a part of the flat layer 2 may be retained in a bottom of the opening hole 31, to make the opening hole 31 be electrically disconnected to the drain 142 (as shown in FIG. 3*a*). And then, the second insulating layer 52 may be formed on the flat layer 2. The third metal layer 43 may be formed on the second insulating layer 52 (as shown in FIG. 3*b*). The third insulating layer 53 may be formed on the third metal layer 43 (as shown in FIG. 3*c*). The first metal layer 41 and the first insulating layer 51 may be formed on the third insulating layer 53 in series. The second insulating layer 52, the third metal layer 43, the third insulating layer 53, the first metal layer 41, and the first insulating layer 51 formed in a bottom of the opening hole 31 and corresponding to the drain 142 may be etched for forming the hole 32, to expose the drain 142 (as shown in FIG. 3*d*). Final, the second metal layer 42 may be formed on the first insulating layer 51, to electrically connect to the drain 142 through the hole 32 (as shown in FIG. 3*e*).

The TFT substrate defines the opening hole in the flat layer to make the opening hole be electrically disconnected to the drain of the TFT. And then, the metal layers and the insulating layers are formed on the flat layer in sequence, and the metal layers and the insulating layers formed in a bottom of the opening hole is etched to expose the drain of the TFT. Final, a metal layer can be formed for electrically connecting to the drain of the TFT through the hole. The present disclosure can avoid the static electricity generated by the insulation layer entering in the TFT through the opening hole, resulting in a polysilicon layer and a gate insulation layer of the TFT being damaged, causing a gate, a source, and a drain short-circuit and the TFT damaged, further led to display panel lighting issues such as bring spots, to improve the qualified rate of product.

The above are merely embodiments of the present disclosure and are not intended to limit the patent scope of the present disclosure. Any modifications of equivalent structure or equivalent process made on the basis of the contents of the description and accompanying drawings of the present disclosure or directly or indirectly applied to other related technical fields shall similarly fall within the scope of patent protection of the present disclosure.

What is claimed is:

1. A thin film transistor (TFT) substrate, comprising:

a TFT;

a flat layer, configured to cover the TFT, the flat layer defining an opening hole corresponding to the drain of the TFT, wherein a part of the flat layer is retained in a bottom of the opening hole to form a flat layer sheet;

a first metal layer, configured to form on the flat layer;

a first insulating layer, configured to cover the first metal layer and the opening hole;

a second metal layer, which is located on the first insulation layer, passes through the flat layer sheet, and electrically connects to the drain;

a second insulating layer located on the flat layer;

a third metal layer located on the second insulating layer; and a third insulating layer located on the third metal layer;

wherein, the first insulating layer extends to be in contact with the drain of the TFT and shields the flat layer sheet, the first metal layer, the second insulating layer, and the third insulating layer from being exposed in the opening hole; edges of the flat layer, of the second insulating layer, of the third insulating layer, and of the first metal layer extending towards the opening hole are all in contact with and sealed by the first insulating layer;

wherein, the first metal layer and the second metal layer are made of indium tin oxide, the flat layer is made of organic photoresist.

2. The TFT substrate according to claim 1, wherein the first metal layer is a common electrode, the second metal layer is a pixel electrode, and the third metal layer is a touch circuit.

3. The TFT substrate according to claim 1, wherein the TFT comprises:

a substrate;

a buffer layer, configured to cover the substrate;

a semiconductor layer, configured to cover a part of the buffer layer, wherein the drain and a source are formed on the semiconductor;

a gate insulating layer, configured to cover the semiconductor and the other part of the buffer layer, wherein a gate is formed on the gate insulating layer; and a dielectric layer, configured to cover the gate insulating layer and the gate, wherein the source and the drain pass through the dielectric layer and are connected to the flat layer.

4. A manufacturing method of a thin film transistor (TFT) substrate comprising:

providing a TFT;

forming a flat layer on the TFT and covering the TFT;

defining an opening hole in the flat layer and corresponding to a drain of the TFT, wherein the opening hole is disconnected to the drain;

forming a second insulating layer on the flat layer, forming a third metal layer on the second insulating layer, and forming a third insulating layer on the third metal layer;

forming a first metal layer on the flat layer and the opening hole;

forming a first insulating layer on the first metal layer, wherein, the first insulating layer extends to be in contact with the drain of the TFT and shields the flat layer sheet, the first metal layer, the second insulating layer, and the third insulating layer from being exposed in the opening hole; edges of the flat layer, of the second insulating layer, of the third insulating layer, and of the first metal layer extending towards the opening hole are all in contact with and sealed by the first insulating layer;

etching a bottom of the opening hole and exposing the drain; and forming a second metal layer on the first insulating layer and electrically connecting to the drain through the opening hole;

wherein, the first metal layer and the second metal layer are made of indium tin oxide, and the flat layer is made of organic photoresist.

5. The manufacturing method according to claim 4, wherein the first metal layer is a common electrode, the second metal layer is a pixel electrode, and the third metal layer is a touch circuit.

6. The manufacturing method according to claim 4, wherein the providing a TFT comprises:

providing a substrate;

forming a buffer layer on the substrate;

forming a semiconductor layer on a part of the buffer layer, wherein the drain and a source are formed on the semiconductor;

forming a gate insulating layer on the semiconductor and the other part of the buffer layer;

forming a gate on the gate insulating layer; and forming a dielectric layer on the gate insulating layer and the gate, wherein the source and the drain pass through the dielectric layer and are connected to the flat layer.

* * * * *